(12) United States Patent
Harder et al.

(10) Patent No.: US 7,994,420 B2
(45) Date of Patent: Aug. 9, 2011

(54) PHOTOVOLTAIC SOLAR CELL AND SOLAR MODULE

(75) Inventors: Nils-Peter Harder, Hameln (DE); Paul Mogensen, Palaiseau (FR); Ulf Blieske, Edingen Neckarhausen (DE)

(73) Assignee: Saint-Gobain Glass France, Courbevoie (FR)

( * ) Notice: Subject to any disclaimer, the term of this patent is extended or adjusted under 35 U.S.C. 154(b) by 1042 days.

(21) Appl. No.: 11/631,610

(22) PCT Filed: Jul. 5, 2005

(86) PCT No.: PCT/FR2005/050547
§ 371 (c)(1),
(2), (4) Date: Mar. 14, 2007

(87) PCT Pub. No.: WO2006/005889
PCT Pub. Date: Jan. 19, 2006

(65) Prior Publication Data
US 2007/0199591 A1 Aug. 30, 2007

(30) Foreign Application Priority Data

Jul. 7, 2004 (DE) .......................... 10 2004 032 810
Sep. 24, 2004 (DE) .......................... 10 2004 046 554

(51) Int. Cl.
*H01L 31/00* (2006.01)
(52) U.S. Cl. ........ 136/256; 136/246; 136/258; 136/259; 136/261; 257/434; 257/436; 257/437; 257/461; 257/432; 438/64; 438/65; 438/72; 438/74; 438/96; 438/97
(58) Field of Classification Search .................. 136/256, 136/252, 258, 257, 261; 257/434, 436, 437, 257/461, 464; 438/96, 97, 64, 65, 72, 74
See application file for complete search history.

(56) References Cited

U.S. PATENT DOCUMENTS

| | | | | |
|---|---|---|---|---|
| 4,406,913 A | * | 9/1983 | Weyrich | 136/259 |
| 5,136,351 A | * | 8/1992 | Inoue et al. | 257/436 |
| 5,370,747 A | | 12/1994 | Noguchi et al. | |
| 5,656,098 A | * | 8/1997 | Ishikawa et al. | 136/256 |
| 5,897,331 A | | 4/1999 | Sopori | |
| 5,981,934 A | * | 11/1999 | Higashikawa | 250/214 R |
| 6,420,647 B1 | * | 7/2002 | Ji et al. | 136/259 |
| 6,734,352 B2 | * | 5/2004 | Hirata et al. | 136/256 |
| 2002/0050289 A1 | * | 5/2002 | Wada et al. | 136/256 |

FOREIGN PATENT DOCUMENTS

| | | |
|---|---|---|
| EP | 0 911 884 | 4/1999 |
| JP | 64-77973 | 3/1989 |
| JP | 1-106472 | 4/1989 |
| WO | WO0190787 | * 11/2001 |

* cited by examiner

*Primary Examiner* — Jennifer K. Michener
*Assistant Examiner* — Matthew T Martin
(74) *Attorney, Agent, or Firm* — Oblon, Spivak, McClelland, Maier & Neustadt, L.L.P.

(57) ABSTRACT

A photovoltaic solar cell including an upper electrode, a layer with light scattering and/or reflection properties, and a lower electrode. The layer with light scattering and/or reflection properties is located between the upper electrode and the lower electrode.

31 Claims, 3 Drawing Sheets

PHOTOVOLTAIC SOLAR CELL AND SOLAR MODULE

The invention relates to a photovoltaic solar cell comprising an upper electrode, a layer with light scattering and/or reflection properties and a lower electrode, solar cells using this type of layer with scattering and/or reflection properties being integrated into a solar module built from these cells.

The term "solar module" is understood here to mean in particular an arrangement of several solar cells electrically connected together in series.

A known problem with photovoltaic solar cells is the deficient use of the incident light. Most particularly in modern thin-film solar cells (for example, in which the absorbent layer is composed of crystalline or amorphous silicon, or contains such), the thicknesses of the functional layers that absorb the light and convert it into electrical energy may be equal to or even less than the wavelengths of the incident light in air. In particular, the layer thicknesses are in part less than the mean depth of penetration of the incident light into the respectively functional absorbent layers. Under these boundary conditions, the energy contained in the incident light is in all cases still absorbed only insufficiently, under direct (perpendicular) irradiation. The efficiency of, or alternatively, the use of the light in, these solar cells is consequently insufficient, in the absence of other measures, to meet the current requirements and demands of effective and economic electricity generation.

Likewise, conventional solar cells, that is to say those manufactured from silicon wafers, or alternatively solar cells manufactured in silicon, for example with thicknesses of greater than 1 to 2 microns, can be improved using the technique of light traps formed for example by structured surfaces and back or lower faces of high light reflectivity in order to optimize the use of the incident light for generating current.

The term "wafers" is understood to mean thin slices of crystalline silicon that can be used as base substrates for the fabrication of solar cells.

In general, thin-film solar cells comprise several layers, namely a transparent upper electrode, which has to let the incident light pass through it, an absorbent layer, which absorbs the light and converts it into electrical energy, and a second, lower electrode (usually a metal electrode), which must not be transparent and can consequently be relatively thick—with a very low surface resistance. Within the context of the invention, an electrode is called an "upper" electrode, as opposed to one called a "lower" electrode, when the "upper" electrode is closest to the substrate through which the light rays pass first.

As regards silicon wafer solar cells these are by nature self-supporting and are equipped with grid electrodes (for example printed electrodes) on the light-incident face. However, they are also usually assembled for the intended use, with large-area substrates, for example the electrodes are inserted between two glass panes.

It is quite general for thin-film solar cells to be built on rigid or flexible substrates. Their electrodes are usually continuous flat electrodes. Where appropriate, there is still a mechanical cover at the back—sometimes the solar cells are placed, for example, in insulating glazing assemblies.

The substrate is called a "superstrate" when, in position, assembled as a solar module, it is turned toward the sun, and is consequently between the sun and the absorbent layers. A superstrate must consequently be transparent and the succession of layers deposited is, in general, in the case of a superstrate: (i) upper electrode; (ii) semiconductor (absorbent layer); (iii) lower electrode. A "true" substrate may, unlike a superstrate, be opaque and the succession of layers deposited is in general, starting from the substrate: (i) lower electrode; (ii) semiconductor (absorbent layer); (iii) upper electrode.

As regards the plane electrodes, these may be composed of several layers. Thus, the lower electrode may comprise a sandwich of doped TCO (transparent conductive oxide), for example ZnO:Al, ITO, $SnO_2$, and of a metal such as silver or aluminum. The upper electrode may comprise a metal layer placed between dielectric antireflection layers and/or also be made of TCO.

Approaches for improving light utilization in solar cells consists firstly in reducing the reflection of light off the outer surface. For this purpose, it is known, on the one hand, to apply an antireflection treatment to the surfaces on the light-incident face, in which treatment antireflection coatings may be deposited and/or microstructures formed on the surface. The aforementioned microstructures may also refract the light and introduce it at flat angles, or even in a diffuse manner, into the absorbent layers. Another known measure consists in producing the transparent upper electrodes of solar cells (the absorbent layers coming directly after said electrodes) that intentionally have a rough surface in such a way that the light is scattered as it passes through the electrode layer into the absorbent layer.

By these means, it is attempted to increase the path length that each light ray travels within the absorbent layer.

Finally, the degree of light utilization may also be improved by backreflection of the amount of light that has passed through the absorbent layer (which is partly transparent because of its low thickness). For this purpose, metal electrodes (that are not transparent) may be used, these usually being placed on that face of the solar cells which is located on the opposite side from the incident light.

Despite all these measures, the current generated by thin-film solar cells still remains much less than that generated by solar cells made from relatively thick silicon wafers. Although it has to be accepted that the latter will always generate more current than thin-film solar cells, the particularly low currents provided by the (less expensive) thin-film solar cells suggest that there is still potential for improvement. However, the presence of rough surfaces in solar cells always constitutes a compromise between optical optimization, as regards the light, and optimization of the purely electrical properties of the solar cell. It may be demonstrated by trials that rough surfaces in the interfaces between the electrodes and the absorbent layer tend to improve the optical properties (for example those measured by the short-circuit current under illumination), whereas in general the electrical properties (for example those measured by the voltage across the open terminals under illumination) deteriorate when the roughness increases.

To achieve light scattering without having rough surfaces would separate the light-trapping effect from the electrical behavior of the solar cells. A higher luminous efficiency may be obtained in this way without the drawback of the electrical function being degraded, and thus at the same time achieving a higher efficiency in converting light into electrical energy.

Document WO 01/90787 A1 discloses a thin light-scattering coating that is very suitable for uniformly scattering the light emitted by a light source. As examples of this application, mention may be made in particular of the backlighting of flat screens, flat lamps, etc. The coating is essentially made up from particles bound with a mineral or organic binder, with a diameter of between 0.3 and 2 µm, the binder representing a volume fraction of 10 to 40% of the coating. The coating has a contrast attenuation of more than 40%. It may have a light transmission of more than 45% or even 60%, in particular when the particles themselves are made up of semitransparent (mineral) materials. The light refraction index of the particles is preferably higher than that of the binder.

The light-scattering layer is preferably deposited with a thickness of between 1 and 20 µm using a suitable process on the surface of the substrate, for example by screen printing, dipping, sprinkling or spraying. It is not by nature electrically conductive, or else is a poor conductor (high ohmic resistance). However, it does scatter the incident light uniformly such that the intensity of scattered light at each viewing angle is proportional to the area of projection. Using additives having a dispersing effect, it is possible to keep within limits the particle agglomerations that might result in undesirable transmission perturbations within the layer.

Patent EP 688 818 B1 discloses preparations based on particles and binders, which are also suitable for light-scattering applications, for example in light-emitting diodes.

Document WO 2004/005978 A1 discloses an application of light-scattering layers of the aforementioned type in combination with an electromagnetic radiation isolation or attenuation layer, having a relatively high surface resistance of more than 100Ω/□. This layer may again contain a TCO or may be composed thereof, the light scattering layer being firstly deposited on a substrate being followed, on the latter, by the electromagnetic isolation layer. The context of such a combination is the application of the light-scattering layer in backlit liquid-crystal displays in which the electro-magnetic isolation must counteract the disturbing influence of the light source located behind the substrate on the liquid crystals.

The problem at the basis of the invention consists in improving the light scattering in photovoltaic cells or solar modules independently of the surface roughness.

According to the invention, this problem is solved by the use of at least one layer with light scattering or reflection properties, in particular a layer composed of light-reflecting particles bound with a mineral or organic binder, follows after at least one of the electrodes in the path of the incident light rays.

The features of the secondary claims provide advantageous embodiments of this invention.

A substantial improvement in light utilization is achieved in photovoltaic cells or solar modules when a light scattering and/or reflection layer of the abovementioned type is combined with one of the layer surfaces of the solar cell, which is reached by the light or through which the light passes. Within the context of the present description, "absorbent layers" is understood to mean not only those that are made of crystalline or amorphous silicon, but also absorbents or absorbent layers made of silicon wafers and also thin films providing a photovoltaic action, such as CIS, CdTe and similar materials.

More generally still (in the case of a solar cell based on a silicon wafer as will become apparent later on in the text), the light scattering and/or reflection layer is combined with the reflecting back or lower electrode located on the opposite side from the light incident face. The term "light scattering layer" should be understood here to mean also a layer that reflects light in addition to its scattering effect.

The light scattering layer, when it has a high light transmission, may be placed between the substrate and the upper electrode, between the upper electrode and the absorbent layer, or also in front of the upper electrode or also between at least two layers of the upper electrode, when the latter is made up of several transparent partial layers (for example a dielectric layer, a metal layer, a dielectric layer), provided that the various materials of the layers are mutually compatible and that the adhesion therebetween can be guaranteed.

According to the invention, it is preferred in particular to combine the lower electrode located on the opposite side from the light-incident face with this light scattering layer. This will then always be useful if the incident light passes at least partly through the absorbent layer. This is also the case with adsorbents in the form of wafers and this becomes increasingly important in the case of thinner wafers. Put more simply, the light passes (partly) through the absorbent layer when the thickness of material of said layer perpendicular to the incidence of the light is less than the absorption length of the light for a wavelength lying above the absorption band edge of the semiconductor that forms the absorbent layer or is contained therein.

According to one advantageous embodiment, the light scattering layer is placed between a transparent (TCO) layer of the lower electrode, being connected to the absorbent layer and the final metal electrode layer. In this case, it is necessary, however, to ensure that there continues to be good electrical contact there between the two electrode layers via the light scattering layer (of high ohmic resistance).

It is also conceivable to have a "double" lining of the solar cell with light scattering layers on each side of the absorbent layer.

The light scattering layer contains, in a manner known per se, particles and binders. Preferably, the particles are transparent or semitransparent in order to maintain as high a light transmission as possible in the light scattering layer. They may in particular be mineral particles, such as oxides, nitrides or carbides.

For manufacturing the particles, it is more preferable to employ metal oxides, such as silicon, aluminum, zirconium, titanium or cerium oxide. Where appropriate, the particles may also be made up of mixtures of at least two of these oxides.

Such particles may be obtained by any manufacturing process known to those skilled in the art. They preferably have a particle size distribution in which at least 50% of the particles differ by no more than 50% from the mean particle size, and they are therefore relatively uniform.

The binder must exhibit sufficient temperature stability to be able to withstand, without being damaged, when the very high temperatures within solar cells they are exposed to strong solar radiation. In this regard, a mineral binder may be advantageous, for example one of the type consisting of potassium silicate, sodium silicate, lithium silicate or aluminum phosphate.

Moreover, in the present application case, the light scattering layer is not exposed to external influences (weather, abrasion) so that its mechanical stability does not constitute a major criterion in material selection. It is then also possible to use a sufficiently temperature-stable organic binder, for example one of the type consisting of polyvinyl alcohol polymers, thermosetting resins, acrylates.

Other important properties of a suitable light scattering layer for the application envisaged here may be found in document WO 01/90787 A1 mentioned in the introduction, the disclosure of which was already partly reproduced in the introduction and is included here explicitly as regards the properties of the layers.

When the light scattering layer described is used in a back reflector of a solar cell, the amount of light that still passes through the light scattering layer is reflected by the metal layer lying behind said light scattering layer and is again subjected to light scattering.

As a result of the natural porosity of the light refraction layer, sufficiently good electrical contact between the metal deposited on the light scattering layer and the TCO layer lying beneath the light scattering layer is guaranteed through the light scattering layer of high ohmic resistance. It has been experimentally demonstrated that the effective transition resistance between the electrode layers can be neglected.

Given that it is possible on the contrary to reduce the surface roughness of the rigid substrates or of the surface electrodes, or even to eliminate said roughness, without appreciably reducing the light scattering effect, this naturally results already in an appreciable improvement in the electrical properties of the solar cell, which more than compensates for any slight increase in the transition resistance between the layers of the lower electrode.

This aside, the substrate may of course be provided on the light-incident face with a surface structure or coating that scatters the light and/or with a surface coating or structure that reduces the reflection of the incident light. Suitable glasses have been manufactured for many years by the Applicant for solar applications and are commercially available under the trademark ALBARINO®.

When, as is usual, one or more solar modules are constructed from solar cells equipped according to the invention which are made up from solar cells electrically connected together in series, then the layer structure may be produced with the light refraction layer firstly over the entire surface of the module, in order in the usual manner for this to be subsequently subdivided into individual solar cells.

Another aspect of the invention relates to the use of silicon-wafer solar cells for which it is general practice to dispense with a TCO layer on the back or lower electrode. In this case, the contact between the substrate (which may act as absorber) and the metal layer is obtained directly. The contact surface between the semiconductor and the metal does, however, have a high recombination activity, that is to say that the minority charge carriers of the electron-hole pairs produced in the silicon as a result of the incidence of the light for current generation "disappear" at the metal-semiconductor interface with a high probability ("surface recombination"). This effect is all the more pronounced the thinner the silicon wafer, or alternatively the thinner the absorber or substrate. It follows that the no-load voltage (open-circuit voltage) of the solar cell drops undesirably, as does also the short-circuit current generated by the light.

With the tendency toward ever thinner absorber, or alternatively, wafer, thicknesses it is consequently of increasing importance to ensure good electronic quality of the back face of the solar cell, or alternatively to passivate the back surface with an appropriate treatment, after which the electron-hole pairs produced by the light can no longer recombine extremely quickly. This is valid independently of whether the wafer is p-doped or n-doped.

In solar cells of high efficiency, the contact between the absorber and the metal layer is consequently reduced to the minimum needed for conduction of the current (for example in what are called point-contact solar cells with a PERL structure, with a PERC structure, with a polka dot structure, etc.).

The efficiency of solar cells is improved by depositing what is called a "passivation" layer (usually a silicon oxide or silicon nitride coating) between the wafer and the metal electrode layer, which layer is interrupted at places or points for the desired contact with the metal. This may be achieved by local masking before the layer is deposited or else by subsequent local removal (structurization by photolithography or laser removal) of the initially complete layer.

The aforementioned operation of producing interruptions in the passivation layer cannot be carried out before the deposition of the back or lower electrode (probably with a cost reduction).

It may also be possible, after deposition over the entire surface of the back or lower electrode, optionally on a passivation/a passivation layer on the entire surface of the wafer, to produce point contacts between the back or lower electrode and the wafer by laser beam or "bombardment" treatment, which contacts pass through an existing passivation.

Another possible way of eliminating layer structurization consists in using metals, in particular aluminum, as an element of the metal layer of the back or lower electrode, which metals pass through the passivation (silicon oxide) layer in the form of needles only in a few places by suitably carrying out the process (for example heat treatment). the semiconductor (silicon) is in contact therewith only at these points.

The metal of the back or lower electrode may itself cause doping in the semiconductor by simple electrical contact—n-type doping or p-type doping depending on the metal.

The behavior of p-doping aluminum will be discussed below, although similar conditions apply to n-doping metals. If the aluminum butts on to a p-type material upon passing through the passivation layer (and let us assume only on the surface), local p-type doping may then occur and thus a BSF (back surface field) may be produced locally at the semiconductor interface with the aluminum contact.

If the aluminum butts on to an n-type material upon passing through the passivation layer (and let us assume only on the surface), the n-type doping may here be locally overcompensated, resulting in two fundamental possibilities.

Firstly, local p-n transitions toward an n-type semiconductor may form, or a locally limited channel of p-type doping material forms, which provides, through an n-doping surface, direct p-type connection between the aluminum and the p-doping semiconductor body.

Instead of a separate passivation layer, it is also possible to form, on a semiconductor with X-type doping, a surface passivation via a surface with Y-type doping, through which a metal of X-type doping can then pass with the effects described above. In this case X and Y replaced p and n, respectively.

By the strict local limitation described above of the direct contact or direct contacting between the metal and the semiconductor, the undesirable rapid recombination is very greatly reduced compared with a contact over an entire surface.

Document WO 01/86732 A1 discloses a process for fabricating a contact, or alternatively an electrode, on a semiconductor surface. Firstly, a crystalline silicon surface is oxidized so as subsequently to deposit an aluminum layer as back or lower electrode on the nonconducting oxide layer. Next, an amorphous silicon layer is deposited on the aluminum layer. By heating this structure at temperatures below the aluminum/silicon eutectic temperature, the oxide layer is locally reduced at the points where it has a lower quality or lower density.

As a result, excessive recombination of the Si semiconductor at the interface with the Al layer is avoided thanks to the intermediate (and only partly penetrated) oxide layer (consequently, the open-circuit voltage of the cell increases), but at the same time this guarantees sufficient electrical contact for the current to be taken off between the wafer and the back or lower electrode via practically point-like holes or tunnels through the oxide.

Approaches for improving light utilization in solar cells consist firstly in reducing light reflection off the external surface. For this purpose, it is firstly known to make the surfaces antireflective on the light-incident face by depositing antireflection coatings and/or by forming microstructures on the surface. The aforementioned microstructures may also refract the light and introduce it into the absorber layers at flat angles, or even diffuse angles. By these measures it is attempted to increase the path length that each light ray travels within the layer of the substrate.

The term "surface" is understood here to mean both the surface of a wafer and the surface of a transparent coating deposited thereon.

Finally, for a high degree of light utilization in a thin-film solar cell in comparison with the mean depth of penetration, the light that has passed through the absorber must also be reflected off the back face. It is possible to use, as mirror, the metal electrodes that are usually placed on the plane face of the solar cells which is located on the opposite side from the light incidence.

The back aluminum contact often applied over the entire surface in conventional solar cells and formed by diffusion generally at high temperature has, however, only a small reflection effect.

A substantial improvement in light utilization in silicon-wafer photovoltaic solar cells is obtained by placing a light scattering and/or reflection layer of the type discussed above between the absorber and the back or lower electrode. In other words, the light scattering layer is combined with the reflecting back electrode located on the opposite side from the light-incident face. The term "light scattering layer" should be understood here to mean also a layer that reflects light in addition to its scattering effect.

When the light scattering layer thus described is used in or on a back reflector of solar cells, the amount of light that still reaches the light scattering layer after having passed through the absorber is reflected, either directly by said light scattering layer or by the metal layer located behind it, and in this case each time undergoes light scattering before again entering the absorber.

This will still be useful when the incident light passes at least partly through the absorber, which is increasingly the case with thinner wafers. In simple terms, the light passes (partly) through the absorber when the thickness of material of the latter, perpendicular to the incidence of the light, is less than the light absorption length for a wavelength above the absorption band edge of the semiconductor that forms the absorber or is contained therein, or at least is no longer than the absorption length only insofar as an appreciable fraction of the light nevertheless passes through the absorber and reaches the back face of the cell.

However, in this case it is necessary to ensure that electrical contact guaranteeing current conduction remains, via the light-scattering layer (possibly of high ohmic resistance), between the absorber and the back or lower electrode. This may be obtained for example by the measures as discussed above as regards contacting at discrete points through a passivation layer.

The degree of porosity of the light scattering layer can be adjusted within wide limits by means of the process parameters during deposition. It has been experimentally confirmed that the effective electrical resistance for transition from one metal layer to another material via this intermediate light scattering layer is negligible. Consequently it is already possible to obtain sufficiently good electrical contact of the metal deposited with the absorber through the light scattering layer, during deposition of the back or lower metal electrode on the light scattering layer (and produced with a certain porosity).

The diffusion of phosphorus is one of the many possible process steps for fabricating emitters on the light-incident face, or alternatively on the front electrode, of a wafer-type solar cell. For example, the light scattering layer and, on it, the metal layer, particularly an aluminum layer, is placed in accordance with the invention, on the back face of a silicon wafer n-doped with phosphorus, optionally around or on its back surface. Once the metal layer (for example an aluminum layer) has been deposited, the metal passes locally at a few points through the partly porous light scattering layer and thus creates at discrete points a contact with the semiconductor. By a suitable heat treatment, the aluminum diffuses into the surface of the silicon wafer and thus produces the contact effects described above (including the penetration of a passivation layer possibly present in addition to the light scattering layer).

This results, in the interface between the absorber and the light scattering layer in contacting at discrete points that can be adjusted by the deposition parameters. On the other hand, when considering the large area, the surface passivation/isolation between the absorber and the metal back or lower electrode is preserved by the light scattering layer. Particular measures (photolithography, laser, masking) may therefore also be omitted during application according to the invention of a light scattering and/or reflection layer.

Thus, by combining the latter layer with passivation (for example $SiO_2$) layers, it is possible to dispense with separate process steps for interrupting the passivation layer, because, by applying a heat treatment, the metal passes in places through the passivation layer and comes into contact with the silicon layer via the aluminum-doped point-like regions.

In addition to the advantage of an enhanced luminous efficiency because of the multiple scattering/reflection of the light rays, varying the deposition parameters of the light scattering layer results in the additional possibility of suitably adjusting its porosity and thus the frequency, or alternatively the distribution, of the point-like contacts between the metal layer and the absorber, and thus of influencing and of improving the electrical quality of the back face of the solar cell. However, according to the abovementioned document WO 01/86732, the density of the contact points must be controlled on the basis of the quality of the passivation oxide. According to the invention, however, there exists, by adjusting the porosity of the light scattering layer between the metal layer and the silicon wafer, a possibility of controlling the contact area (number of contact points) independently of the quality of the oxide. The quality of the oxide can consequently be optimized only with regard to the quality of the surface passivation.

As another key advantage, the invention exploits the light scattering properties of the partially porous layer between the metal and the silicon wafer, the absorption of the incident light and consequently, the amount of current generated being stimulated by extending the optical path lengths and by the light trap effects.

It is thus possible to deposit a light scattering layer also on the light-incident face, if this has a high light transmission. It may then be placed above the front electrode or between the front electrode and the absorber.

To fabricate solar cells of the abovementioned type (namely with a silicon wafer), the following process may be employed.

As raw material, p-type silicon wafers are used. By phosphorus diffusion, an n-type surface (as emitter) is produced (at least) on the front face of the wafer. However, phosphorus diffusion as a general rule acts on both faces of the wafer, because the back face is not masked.

On this back face, a light scattering layer is therefore deposited followed, on said layer, by an aluminum layer acting as the metal back or lower electrode. Already in this step of the process, the aluminum passes, locally at a few points, through the partially porous light scattering layer and touches the silicon wafer thereat. The intermediate product is heated. As a result of known effects of aluminum penetration through the silicon oxide and of aluminum diffusion in the wafer, the n-doping by the phosphorus possibly present on the back surface of the wafer is overcompensated there by aluminum parts, that is to say the back face again becomes p-doped (as prior to the phosphorus diffusion) locally and at discrete points on the surface.

This manner of proceeding therefore results, before deposition of the back contact, "without more ado", in an n-type surface which can therefore then be used, as described above, to obtain, in combination with the light scattering layer, a well passivated back face with point-like contacts, which face also scatters and reflects the light.

Without this n-type surface doping of the rear face, it is possible in a similar manner to use a passivation layer, for example made of $SiO_x$, penetrated only at discrete points by the aluminum. This is also valid in the case of strong p-type surface doping applied to the entire surface, which admittedly already naturally produces a certain passivation layer by the formation of the abovementioned "back surface field", but which is markedly better in terms of quality when the contact with the metal is limited to small areas.

A natural extension of the invention is the fact that it can also be applied to more expensive solar cell structures that have both p-type and n-type regions on the back face and which are then provided for example with interdigitated comb contacts.

Further details and advantages of the subject of the invention will become apparent from the drawings of several illustrative examples and from their detailed description that follows.

In these drawings, which are simplified representations on no particular scale.

Figure 1:
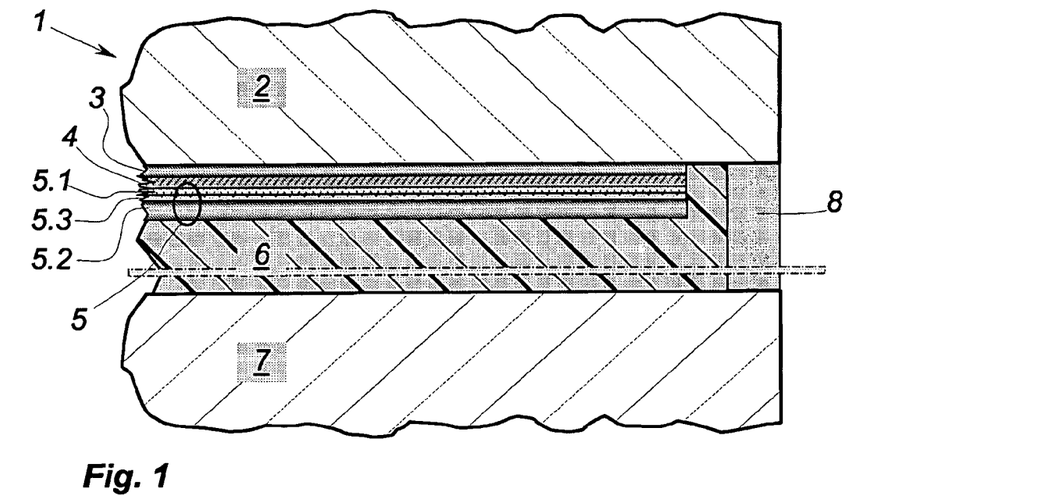
FIG. 1 shows a schematic sectional view of a solar cell in which a light scattering layer is placed between two layers of the lower electrode.

In FIG. 1, the solar cell 1 comprises, in the basic structure, a substrate 2 (made of glass or plastic), a transparent flat or upper electrode 3, deposited on the latter, made of an electrically conductive oxide or made of another appropriate material or layer system (shown, in order to simplify matters, as a uniform single layer), an absorbent layer (4) made of a material exhibiting photovoltaic activity, such as amorphous or polycrystalline silicon, possibly also of a thin film such as CIS or CdTe, a lower electrode 5 made of a transparent TCO layer 5.1 and a metal layer 5.2 Placed between the layers 5.1 and 5.2 is a light scattering layer 5.3. Preferably, the respective faces of the TCO layers 3 and 5.1 turned toward the absorbent layer are relatively rough so that they scatter the light that passes through them (see FIG. 2).

The metal layer 5.2 is followed, in a manner known per se, by an intermediate layer 6 and a back cover 7. The intermediate layer 6 serves for the adhesive surface assembly of the solar cell 1 together with its substrate to the cover 7. It is known to produce these intermediate layers from a casting resin or from thermoplastic sheets, which of course must each time be compatible both physically and chemically with the layers of the solar cell. The intermediate layer 6 is hermetically sealed along the outer edge of the solar cell with an edge seal 8. The edge seal adheres strongly to the two rigid panes (the substrate 2 and the cover 7).

These two panes may be made of glass, optionally prestressed, or made of plastic, for example polycarbonate. Optionally, it is possible to use one pane made of glass, preferably the transparent substrate 2, and the other made of plastic.

The thicknesses of the individual panes cannot be drawn to scale here. However, the intermediate layer 6 is regularly substantially thicker than the respective functional electrode layers 3 to 5. This is why the figure indicates, with a double dot/dash line, that part of the thickness of the intermediate layer 6 has been omitted. The metal layer 5.2 of the lower electrode 5 may again, as indicated, be thicker than the other functional layers.

Figure 2:
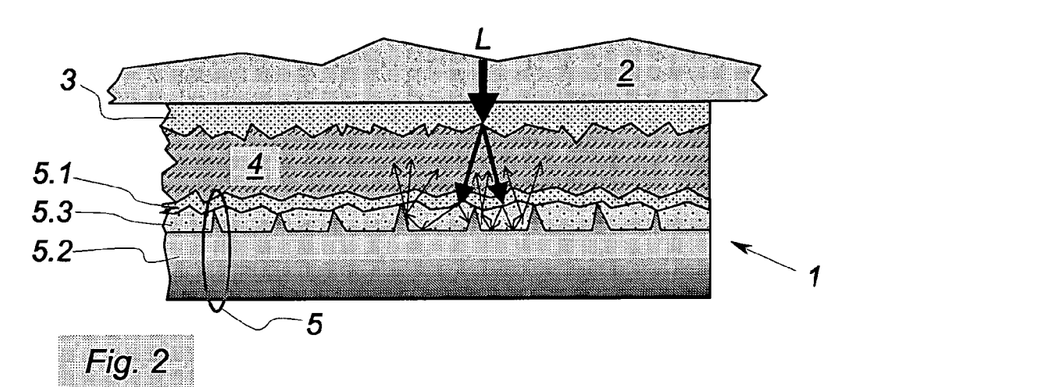
FIG. 2 illustrates a first embodiment of a solar cell in enlarged detail.

The detail shown in FIG. 2 illustrates the operating principle of the arrangement of layers of the solar cell 1. Components identical to those of FIG. 1 are denoted by the same numerical references as in the latter. This again shows the substrate 2 with the upper electrode 3 deposited thereon, represented as a uniform layer in order to simplify the drawing. That surface of the latter on the opposite side from the substrate and turned toward the absorbent layer has been intentionally formed so as to be relatively rough (the roughness may be widely varied by suitably setting the deposition parameters, for example during the sputtering, sputtering followed by etching or chemical vapor deposition (CVD) of such layers, for example by reducing the pressure of the working gas or, in the case of sputtering, by increasing the sputtering energy).

It goes without saying that, when observed under a microscope, even the surface of the (glass) substrate 2 itself has a certain roughness, which, however, has been neglected here. It is possible however for a surface structure of the glass to be suitably used for effective light scattering.

The TCO electrode layer 5.1 follows the absorbent layer 4, also being made with a certain surface roughness, then the light scattering layer 5.3 and finally the metal layer 5.2. To illustrate the direct electrical contact between the metal layer 5.2 and the TCO layer 5.1, a few "peaks" in the metal layer 5.2 have been drawn here, which peaks pass through the light scattering layer 5.3.

These peaks form almost automatically as the metal layer is being deposited on the relatively porous layer 5.3. In other words, during deposition of the metal layer 5.2 on the light scattering layer 5.3, clusters of metal atoms penetrate so far into the pores of the layer 5.3 that they provide, or alternatively form, direct galvanic contact with the TCO layer 5.1. This process too may be enhanced by suitable adjustment of the porosity of the layer 5.3 and by suitable adjustment of the parameters for depositing the metal layer 5.2 (lower pressure of the working gas, high sputtering energy).

The mode of operation of the light scattering layer and the concomitant better utilization of the incident light in the solar cell 1 will now be explained in further detail with the aid of an example that is greatly simplified from the graphical standpoint. It should be pointed out that the geometrical aspect forming the basis of the description, which is purely illustrative in the ratios discussed here between the wavelength of the light and the sizes of the surface structures, is no longer suitable just for a correct physical description. For a precise description, it would be necessary to take into account interference and near-field defects. However, the geometrical aspect lends itself well to an intuitive description, in order to understand the principle of the effects exploited by the invention.

A light ray L passing vertically downward through the substrate 2 and the transparent upper electrode 3 in the solar cell 1 is firstly refracted (dissociated) at the uneven interface between the upper electrode 3 and the absorbent layer 4, and is consequently already scattered in the latter. The unabsorbed portion of the light falls on the rough surface of the layer 5.1 and is also partly scattered therein, and also partly reflected, depending on the angle of incidence. Those portions that have passed through then reach the light scattering layer 5.3 and are further refracted/scattered therein, and reflected by the metal layer 5.2 into the layer 5.3 and again refracted/scattered by the latter.

In total, the single incident light ray L is thus split into a multitude of ray paths, which all extend over a relatively large length through the absorbent layer 4 and thus significantly increase the degree of light utilization. It should also be stressed that the actual representation of the light rays serves merely to illustrate the action of the light scattering layer and only reproduces in a very limited fashion the effective refraction and reflection phenomena.

Figure 3:
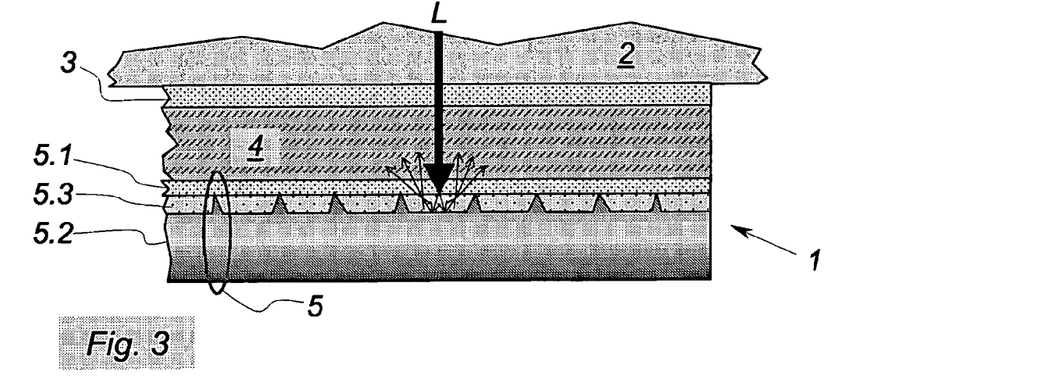
FIG. 3 illustrates a second embodiment similar to FIG. 2, in which the surface roughness of the flat electrodes has, however, been reduced.

Whereas FIG. 2 shows part of a type of solar cell or multilayer structure produced somewhat conventionally with rough electrode surfaces, in order to represent the invention, the same detail of FIG. 3 shows an alternative embodiment. Here, the upper electrode 3 and also the TCO layer 5.1 of the lower electrode are shown as now having smooth surfaces (at least from the macroscopic standpoint). Consequently, they do not refract the light ray L or in any case refract it less strongly than their equivalent components in FIG. 2.

It is only at the entry into the light scattering layer 5.3 that the ray L is refracted and appreciably split up, thereby propagating further after reflection off the metal layer 5.2. Here again, this results in better light utilization mainly in the absorbent layer 4, which is again accompanied by improved electrical properties in the transition (interface) zone between the absorbent layer 4 and the electrodes.

Figure 4:
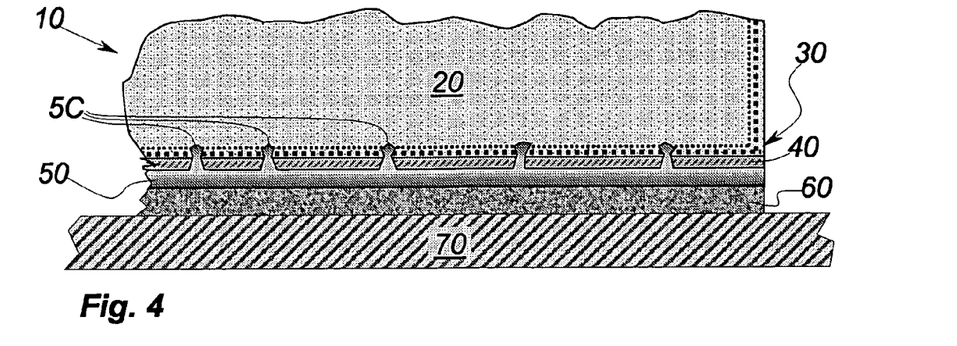
FIG. 4 is a schematic partial sectional view of a silicon-wafer solar cell, in which a light scattering layer is placed between the absorber with n-type surface doping and the lower or back electrode.

In FIG. 4, the solar cell 10 comprises, in the basic structure, an absorber 20 in the form of a silicon wafer, the surface of which has received n-type surface doping by an appropriate treatment, for example by phosphorus diffusion. This doping, which decreases from the surface toward the interior of the wafer/absorber, is shown in a highly simplified manner by two dotted lines 30 drawn along the outer edges of the absorber 20. The doping does not have also to be present on the lateral surface, contrary to the representation.

That face of the absorber 20 lying at the top in the drawing is turned toward the incident light. To simplify matters, a wafer surface with n-type doping, as a general rule on a p-type silicon wafer and provided with a front electrode or alternatively an "emitter", has not been shown.

Deposited directly on the rear face of the absorber 20, lying on the opposite side from the incident light, is a light scattering layer 40 on which a metal lower or back electrode 50 has again been deposited in the form of a layer. The lower or back electrode is preferably made of aluminum or contains this metal, it being particularly recommended in the present application because of its good silicon-doping properties and its capability of penetrating a surface passivation layer, for example made of silicon oxide.

Again indicated, schematically, beneath the lower or back electrode 50 are an adhesive or intermediate layer 60 and a support plate 70. This plate can be used, in a manner known per se, for mounting a solar module formed from a plurality of solar cells 10 electrically connected in parallel and/or in series. The adhesive layer may be prepared from a casting resin or from thermoplastic films, which of course must be physically and chemically compatible with the adjacent components of the solar cells. If required, a cover will of course also be provided on the light-incident face of the solar cells, the light transmission of said cover having to be as high as possible.

The light scattering layer 40 acts here as a flat isolator between the absorber 20 and the lower or back electrode 50. The latter must consequently be, in a manner known per se, in conducting electrical connection with the absorber 20, at least at discrete points. The expression "at discrete points" must be understood here to mean that a contact, extending over the entire surface of the electrode and of the wafer, is formed by a plurality of small individual surfaces.

This definition of the term "discrete" also includes structures that appear as discrete points only in cross section, such as for example linear contact zones. These zones are indicated by a number of projections 5C (or "peaks") of the lower or back electrode layer 50, which extend through the light refraction layer 40 having a desired porosity right into the body of the absorber 20 which projections in certain cases also pass through existing zones of n-type surface doping of the wafer. From the highly simplified representation, it is of course not possible to draw conclusions as to the actual structure, or to the cross sections, of these projections and as to their chemical composition.

Figure 5:
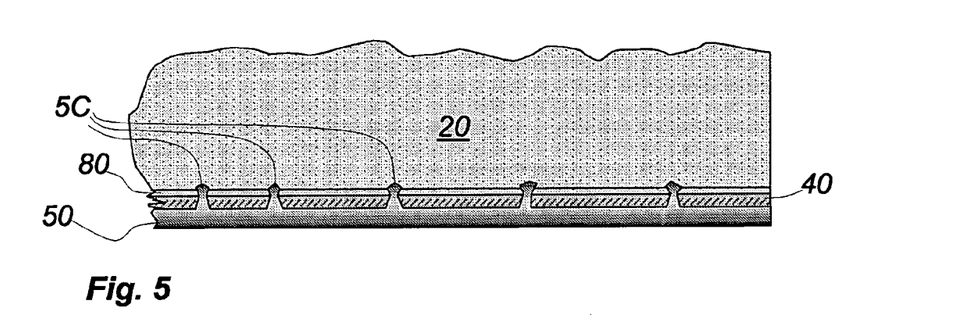
FIG. 5 is a schematic partial sectional view of a silicon-wafer solar cell, in which a light scattering layer is placed between a passivation layer and the lower or back electrode.

The embodiment shown in FIG. 5 includes a passivation layer 80 in the form of a light-permeable discrete layer between the absorber 20 and the light scattering layer 40. The layer 80 may be combined with n-type or p-type surface doping (lines 30) of the wafer as shown in FIG. 4, or it may replace such doping. Preferably, said layer 80 is made from $SiO_x$ or $SiN_x$, or it contains these silicon compounds.

The thicknesses of the various layers cannot be drawn to scale here.

The example shown in FIG. 5 has again in all cases, in a manner corresponding to FIG. 4, a discrete contact as defined above between the lower or back electrode 50 and the wafer or absorber 20. As may be seen, these extend not only through the light scattering layer 40 but also through the passivation layer 80.

The detail shown in FIG. 6 again illustrates the operating principle of the multilayer structure of the solar cell 10 according to the invention. Components identical to those in FIG. 4 bear the same numerical references. This again shows the wafer 20 with the layers 80, 40 and 50 deposited on its back face.

Figure 6:
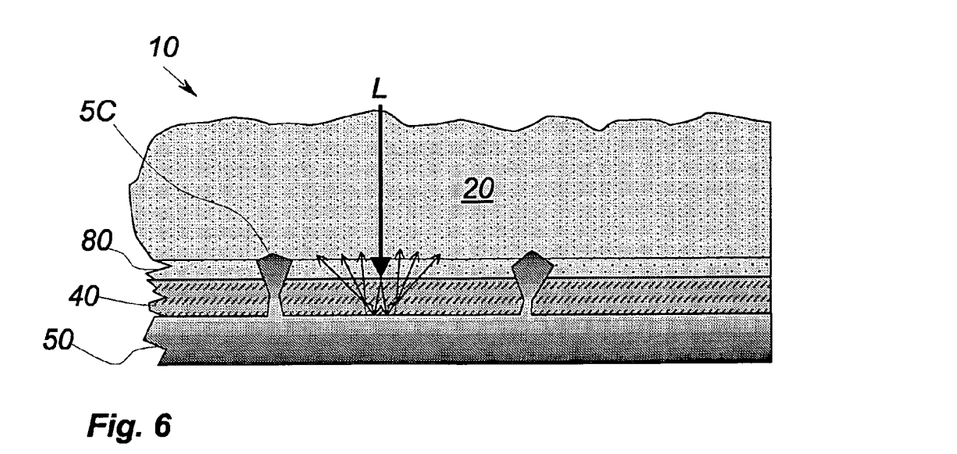
FIG. 6 shows an enlarged detail, similar to FIG. 5, in which the refraction of the light ray between the back electrode and the absorber has been indicated.

The mode of operation of the light scattering layer and the improved utilization of the incident light that stems therefrom in the solar cell 10 will be explained in detail with the aid of a graphically greatly simplified example. It should be pointed out in this case that the geometrical aspect at the basis of this intentionally illustrative description for the ratios discussed here between the wavelength and the magnitude of the surface structures is no longer suitable by itself for a correct physical description. Interference effects and near-field effects would have to be taken into account for a correct description. Nevertheless, the geometrical aspect is suitable for an intuitive description so as to understand in principle the effects used by the invention.

If a light ray L falling vertically downward still passes through the absorber 20, it may firstly be refracted (split, scattered) at the nonplanar interface between the absorber 20 and the passivation layer 80 and partially reflected and consequently again scattered in the latter (not shown here to simplify matters).

That portion of the light ray not yet absorbed and not reflected at the aforementioned interface falls on the surface of the light scattering layer 40 and is also partially scattered therein, and also partially reflected, depending on the angle of incidence and the microscopic position. However, the amount of light reflected off the layer 40 has not been shown, in order to simplify the drawing.

Those portions that have passed through undergo multiple reflections and are thus either backscattered in the silicon wafer or then enter, again, the interface with the metal layer 50, which again reflects them into the light scattering layer 40. Given that the light scattering layer 40 does not absorb the light, or does so only very little, these portions of the light are again sent into the absorber 20 of the solar cell 10.

In total, the individual light ray L is split into a multitude of ray paths, which all extend over a relatively long length in the absorber 20 and thus greatly increase the degree of light utilization. Once again, it should be pointed out that the actual representation of the light rays serves only to explain the effect of the light scattering layer and that it reproduces the actual refraction and reflection phenomena only in a very limited manner.

Figure 7:
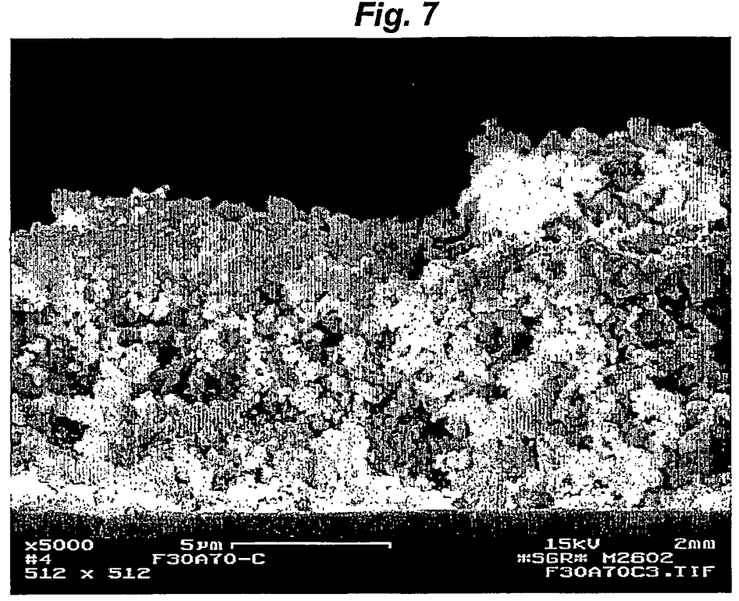
FIGS. 7 and 8 are SEM micrographs of the absorbent layer used in the embodiments of the invention.
Figure 8:
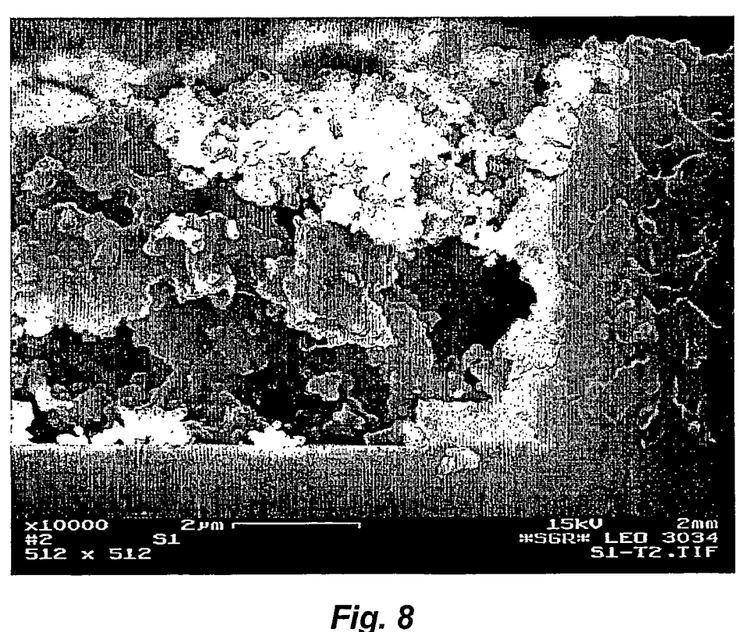

As may be seen in FIGS. 7 and 8, it is apparent that the layer (5.3, 40) having light scattering and/or reflection properties and used for its properties that promote light scattering and reflection is also porous.

Owing to this open porosity, the inventors have been able to demonstrate that the interstices inside the porous network establish electrical contacts within this layer, although the constituent material is intrinsically an electrical nonconductor and has not undergone a post-treatment (laser irradiation treatment, etching). Under preferred conditions (choice of particle size, choice of binder, choice of particles) for obtaining this layer, the porous network then exhibits optimum characteristics for establishing electrical contacts with adjacent layers (conductive layers and/or a doped substrate).

Another aspect of the invention relates to the use of a light scattering and/or reflection layer consisting of agglomerated particles in a binder, the particles having a mean diameter of between 0.3 and 2 microns, in that the binder being in a proportion of between 10 and 40% by volume, the particles forming aggregates whose size is between 0.5 and 20 microns, and preferably less than 5 microns, the layer having a contrast attenuation of greater than 40% for photovoltaic solar cells, this layer having a certain porosity and being placed between an electrode layer and the absorbent layer or between two partial electrode layers, and the electrical contacts between the conducting layers on both sides of the light scattering layer being made through the porosity of said layer.

The invention claimed is:
1. A photovoltaic solar cell comprising:
an upper electrode;
an absorbent layer;
a layer with light scattering and/or reflection properties, including particles bound with a mineral or organic binder, the particles having light scattering and/or reflection properties; and
a lower electrode,
wherein the layer with light scattering and/or reflection properties is disposed between the upper electrode and the lower electrode,
wherein local electrical contacts extend through pores present in the layer with light scattering and/or reflection properties, and
wherein the thickness of the layer with light scattering and/or reflection properties is at least equal to or greater than the mean diameter of the particles therein.

2. The photovoltaic solar cell as claimed in claim 1, wherein the upper electrode is transparent, and
wherein the layer with light scattering and/or reflection properties follows after at least one of the electrodes in a path of incident light rays.

3. The solar cell as claimed in claim 2, further comprising a transparent substrate, wherein the layer with light scattering and/or reflection properties has a high light transmission, which is not less than 60%, and is placed between the upper electrode and the absorbent layer or between at least two layers of the upper electrode.

4. The solar cell as claimed in claim 2, wherein the layer with light scattering and/or reflection properties is placed on the lower electrode.

5. The solar cell as claimed in claim 2, wherein the lower electrode includes a first layer and a second layer,
wherein the layer with light scattering and/or reflection properties is enclosed between the first layer and the second layer of the lower electrode, and
wherein the first layer of the lower electrode, lying between the absorbent layer and the layer with light scattering and/or reflection properties, is transparent.

6. The solar cell as claimed in claim 5, wherein the lower electrode comprises at least one transparent TCO layer, following after the absorbent layer, and a metal layer, the metal layer reflecting the light incident thereon.

7. The solar cell as claimed in claim 5, wherein direct electrical connections are made between the first and second layers of the lower electrode via pores in the layer with light scattering and/or reflection properties.

8. The solar cell as claimed in claim 2, wherein the particles with light scattering and/or reflection properties include semitransparent mineral oxide, nitride or carbide particles, a size of the particles ranging between 0.1 and 3 µm.

9. The solar cell as claimed in claim 2, wherein the binder constitutes a proportion by volume of 10 to 40% of the layer with light scattering and/or reflection properties.

10. The solar cell as claimed in claim 9, wherein a light refractive index of the particles is higher than that of the binder.

11. The solar cell as claimed in claim 2, wherein the layer with light scattering and/or reflection properties has, for a layer thickness of between 1 and 20 µm, a light transmission of more than 45%.

12. The solar cell as claimed in claim 2, wherein the layer with light scattering and/or reflection properties further includes scattering components that prevent particle agglomeration.

13. The solar cell as claimed in claim 2, wherein at least one of the electrodes or a partial layer of the electrodes is deposited with an increased roughness of its surface contiguous with a series of layers.

14. The solar cell as claimed in claim 3, wherein the transparent substrate is provided on a light-incident face with a structure or with a surface coating that scatters light and/or with a coating that decreases light reflection.

15. The solar cell as claimed in claim 2, wherein the absorbent layer includes crystalline or amorphous silicon.

16. The solar cell as claimed in claim 2, wherein the absorbent layer is composed of a thin-film system, the thin-film system including films having one or more of CIS and CdTe.

17. The solar cell as claimed in claim 2, wherein the absorbent layer includes a silicon wafer.

18. A silicon-wafer photovoltaic solar cell comprising:
an upper electrode;
an absorber;
at least one layer with light scattering and/or reflection properties including particles bound with a mineral or organic binder, the particles having light scattering and/or reflection properties;
a metal lower electrode; and
means for scattering incident or reflected light in the absorber;
wherein at least a surface of the absorber, which is turned toward the lower electrode, is passivated, by doping and/or by a separate layer, and
wherein the at least one layer with light scattering and/or reflection properties is disposed between the absorber and the lower electrode, in which at least local electrical contacts between the lower electrode and the absorber extend through at least one of pores present in the at least one layer with light scattering and/or reflection properties and passages made therein.

19. The solar cell as claimed in claim 18, wherein at least the passivated surface of the absorber, made of n-doped or p-doped silicon, is passivated either by n-type doping or by p-type doping, and/or by a passivation layer, the passivation layer being made of silicon oxide or silicon nitride, or containing such materials, so as to minimize surface recombination.

20. The solar cell as claimed in claim 18, wherein the particles having light scattering and/or reflection properties include at least one of semitransparent mineral oxide, nitride and carbide particles, a size of the particles ranging between 0.1 and 3 μm.

21. The solar cell as claimed in claim 18, wherein the binder constitutes a proportion by volume of 10 to 40% of the layer with light scattering and/or reflection properties.

22. The solar cell as claimed in claim 18, wherein a refractive index of the particles is different from that of the binder.

23. The solar cell as claimed in claim 18, wherein a cover is provided on a light-incident face of the absorber, the cover having a surface structure or a coating that scatters the light and/or having a coating that reduces the light reflection.

24. The solar cell as claimed in claim 18, wherein a second layer with light scattering and/or reflection properties, of high light transmission, is placed on a light-incident face of the absorber, the second layer including particles having light scattering and/or reflection properties.

25. A solar module including a plurality of solar cells as claimed in claim 2, the cells being electrically connected together, in which the solar cells are fixed to a common support structure.

26. A solar module including a plurality of solar cells as claimed in claim 2 that are electrically connected together.

27. The solar module as claimed in claim 26, wherein the layer with light scattering and/or reflection properties forms part of an electrode layer used in common by the solar cells or is connected to an electrode layer.

28. A layer with light scattering and/or reflection properties for photovoltaic solar cells as claimed in claim 1, wherein the layer with light scattering and/or reflection properties has a predetermined porosity and is placed in at least one of between an electrode layer and the absorbent layer and between two partial electrode layers,
wherein electrical contacts are provided between conducting layers on both sides of the layer with light scattering and/or reflection properties, and
wherein the electrical contacts are made through the porosity of the layer with light scattering and/or reflection properties.

29. The photovoltaic solar cell as claimed in claim 1, wherein a bottom surface of the layer with light scattering and/or reflection properties, disposed between adjacent local electrical contacts passing through the layer, is substantially parallel to a top surface of the layer with light scattering and/or reflection properties.

30. The solar cell as claimed in claim 18, wherein a bottom surface of the layer with light scattering and/or reflection properties, disposed between adjacent local electrical contacts passing through the layer, is substantially parallel to a top surface of the layer with light scattering and/or reflection properties.

31. The solar cell as claimed in claim 11, wherein the light transmission is more than 65%.

* * * * *